(12) United States Patent
Curbelo et al.

(10) Patent No.: US 8,723,590 B2
(45) Date of Patent: May 13, 2014

(54) POWER SWITCH CURRENT ESTIMATOR AT GATE DRIVER

(75) Inventors: Alvaro Jorge Mari Curbelo, Unterschleissheim (DE); Thomas Alois Zoels, Unterschleissheim (DE)

(73) Assignee: General Electric Company, Niskayuna, NY (US)

( * ) Notice: Subject to any disclaimer, the term of this patent is extended or adjusted under 35 U.S.C. 154(b) by 297 days.

(21) Appl. No.: 12/977,480

(22) Filed: Dec. 23, 2010

(65) Prior Publication Data

US 2012/0161852 A1    Jun. 28, 2012

(51) Int. Cl.
*H03K 17/60*      (2006.01)
*H03K 17/567*    (2006.01)

(52) U.S. Cl.
CPC .................................. *H03K 17/567* (2013.01)
USPC ........................................................ 327/432

(58) Field of Classification Search
USPC .......................... 327/108, 427, 432, 434, 437
See application file for complete search history.

(56) References Cited

U.S. PATENT DOCUMENTS

| | | | |
|---|---|---|---|
| 5,936,820 A | 8/1999 | Umemura et al. | |
| 6,097,582 A | 8/2000 | John et al. | |
| 6,304,472 B1 | 10/2001 | Nagasu et al. | |
| 6,330,143 B1 | 12/2001 | Maly et al. | |
| 7,199,548 B2* | 4/2007 | Inaguma et al. | 318/727 |
| 7,519,753 B2* | 4/2009 | Misawa et al. | 710/110 |
| 7,652,510 B2* | 1/2010 | Izumi et al. | 327/108 |
| 7,679,342 B2 | 3/2010 | Lopata et al. | |
| 7,932,583 B2* | 4/2011 | Ruething et al. | 257/577 |
| 2004/0004502 A1* | 1/2004 | Miyamoto | 327/199 |
| 2009/0039869 A1 | 2/2009 | Williams | |

OTHER PUBLICATIONS

Lukic et al., "Self-Tuning Digital Current Estimator for Low-Power Switching Converters", Applied Power Electronics Conference and Exposition, Feb. 24-28, 2008.
Prodic et al., "Digital PWM Controller and Current Estimator for A Low-Power Switching Converter", 7th IEEE Workshop on Computers in Power Electronics, Jul. 16-18, 2000, Blacksburg, VA.
EPO Application No. 11193777—Search Report dated Mar. 23, 2012; 7 Pages.

* cited by examiner

*Primary Examiner* — Sibin Chen
(74) *Attorney, Agent, or Firm* — Seema S. Katragadda

(57) ABSTRACT

A power switch current estimator for a solid state power switch. The power switch includes a control terminal, an input current power terminal, and an output current power terminal. The power switch is further configured with at least one sense terminal. One or more parasitic elements define an electrical pathway between a power terminal and a corresponding sense terminal. A driver unit that selectively turns the power switch on and off is connected to the control terminal and a sense terminal. A current estimator generates an estimated level of current circulating through the solid state power switch in real time in response to one or more switching events of the power switch. The estimated level of current is based on values of at least one of the parasitic elements such that the estimated level of load current substantially corresponds to an actual level of load current circulating through the solid state power switch.

20 Claims, 5 Drawing Sheets

POWER SWITCH CURRENT ESTIMATOR AT GATE DRIVER

BACKGROUND

The invention relates generally to electronic power switches and more particularly to a method of estimating main load current circulating through a high power switch taking place at the driver unit of the switch without any need for mounting dedicated large scale current sensors in the system employing the electronic power switch, to determine the conditional state of the power switch or to estimate temperatures associated with the power switch.

Current flows through various elements of a solid state main load current conducting power switch. Some of these elements are of parasitic or unwanted nature. Voltage drops are induced in these elements during current transients.

In low voltage applications, various types of shunt devices have been employed in series to the main current path. Such use of shunt devices is not possible in high current modules because they destroy the smooth symmetry conditions and are a likely cause of overvoltage failures.

In view of the foregoing, there is a need for a technique for estimating a main load current circulating through a high power switch taking place at the driver unit of the switch without any need for mounting dedicated large scale current sensors in the system employing the electronic power switch, to determine the health state of the power switch or to estimate temperatures associated with the power switch. It would be advantageous if the technique allowed efficient protection of the high power switch by enabling self turn-off during deleterious operating conditions that could prove harmful to the high power switch.

BRIEF DESCRIPTION

Briefly, in accordance with one embodiment, a power switch current estimator comprises:

a solid state power switch comprising a control terminal, an input current power terminal, an output current power terminal, and an output current sense terminal, wherein one or more parasitic elements define an electrical pathway between the output current power terminal and the output current sense terminal;

a driver unit connected to the control terminal and the output current sense terminal, the driver unit selectively turning the power switch on and off; and a current estimator configured to generate an estimated level of current circulating through the solid state power switch in response to one or more switching events, the estimated level of current based on values of at least one of the parasitic elements such that the estimated level of load current substantially corresponds to an actual level of load current circulating through the solid state power switch.

DRAWINGS

These and other features, aspects, and advantages of the present invention will become better understood when the following detailed description is read with reference to the accompanying drawings in which like characters represent like parts throughout the drawings, wherein.

Figure 1:
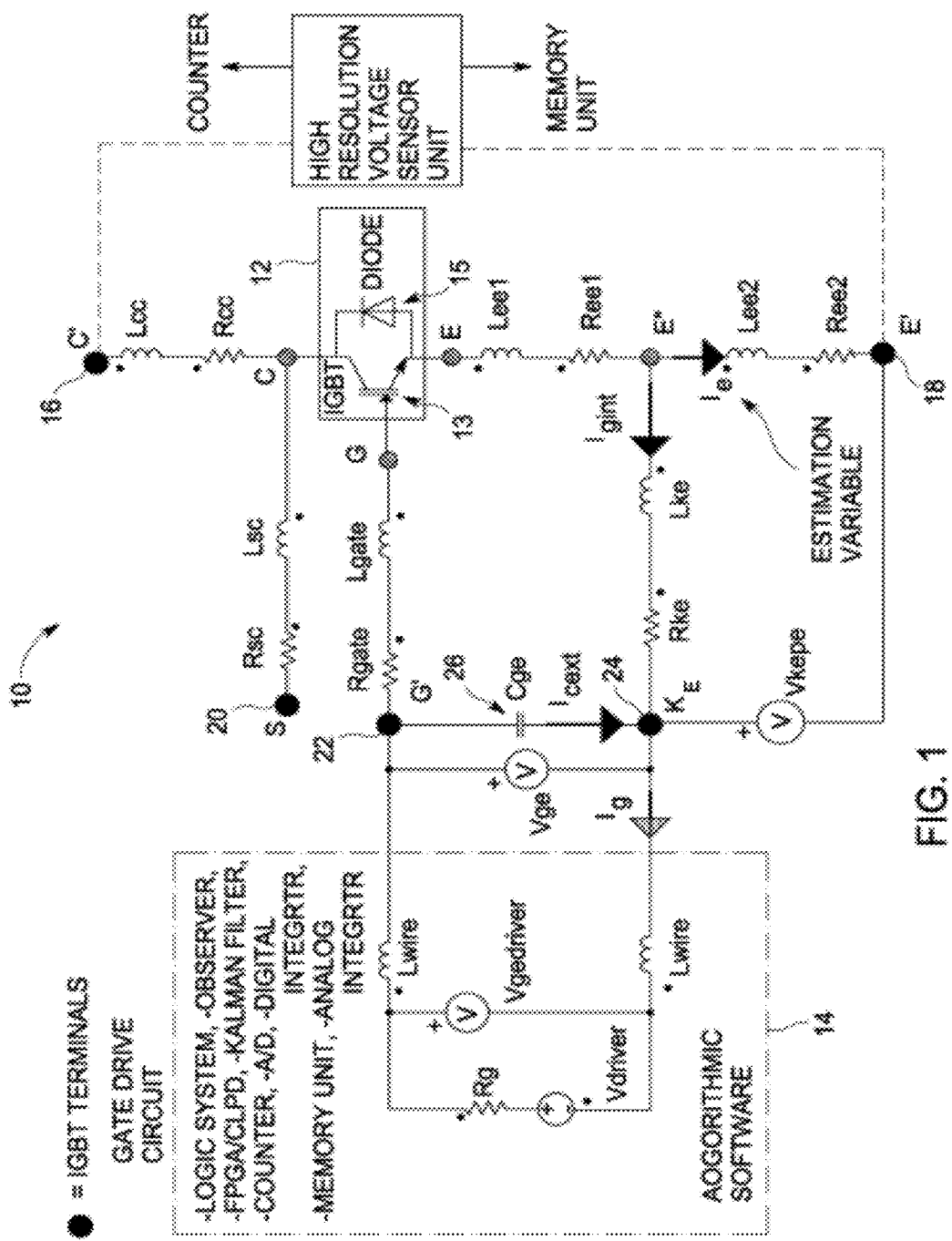
FIG. 1 is a parasitic element circuit model illustrating an insulated gate bipolar transistor (IGBT) power switch driven by a gate drive circuit, according to one embodiment of the invention.
Figure 3:
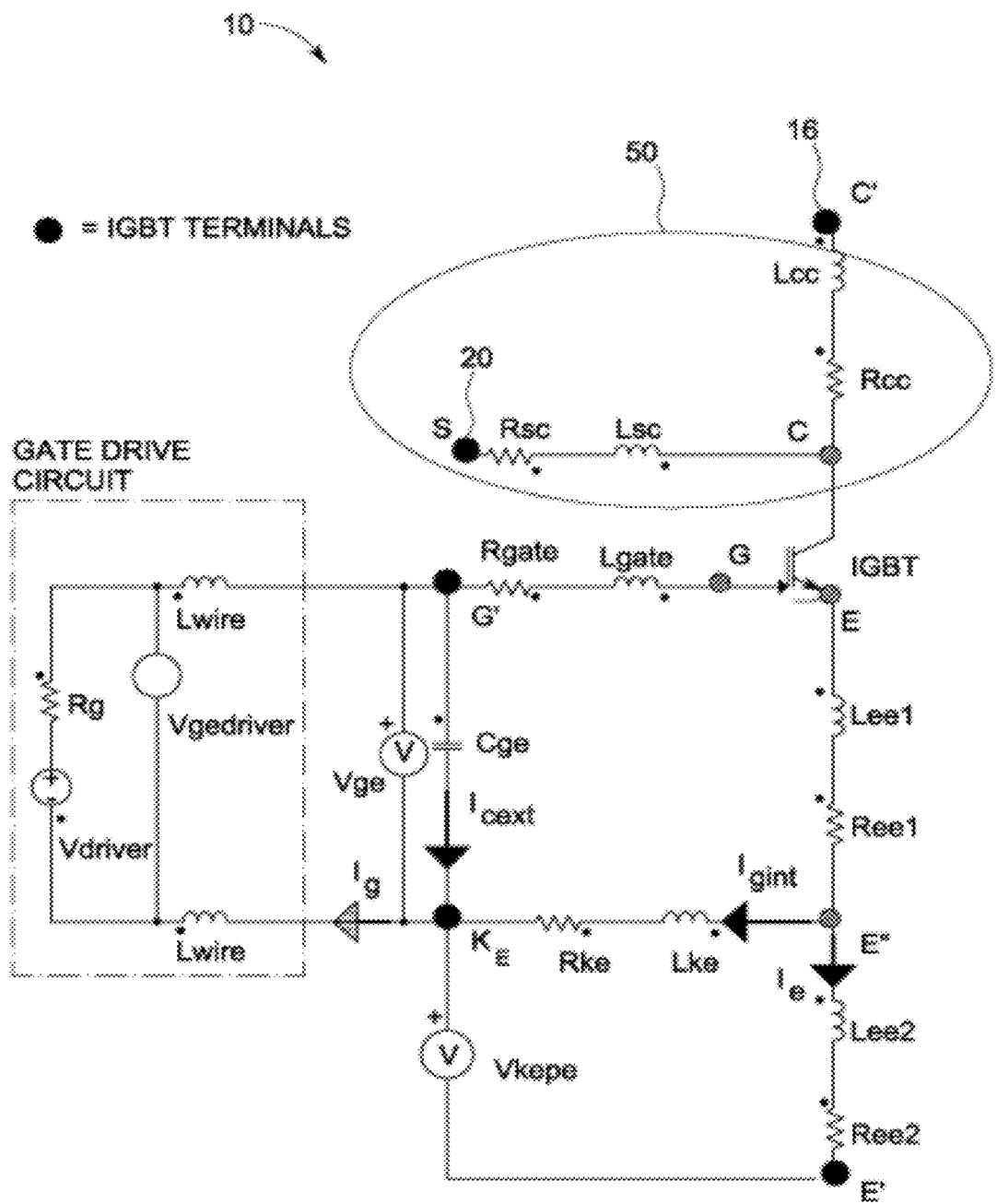
Figure 4:
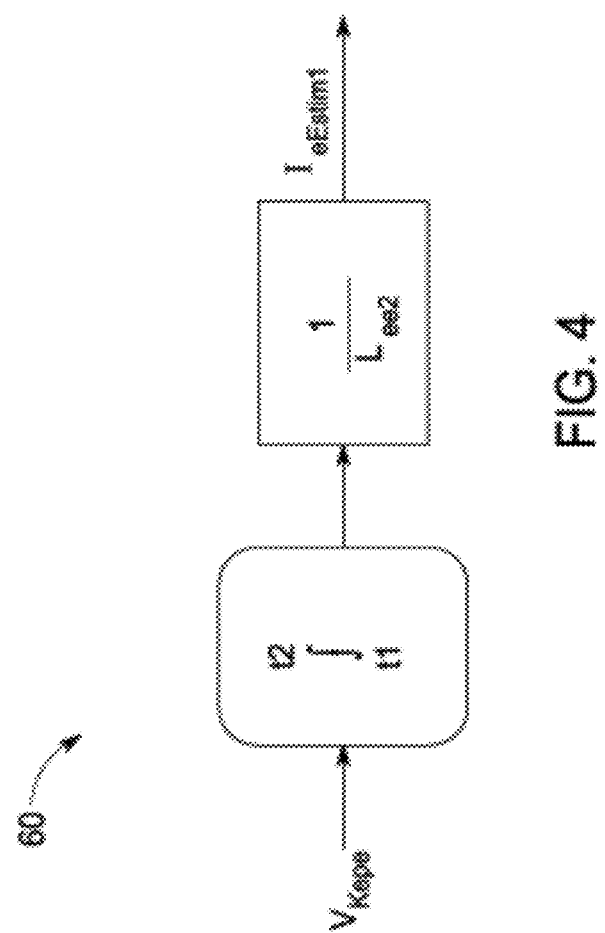
Figure 5:
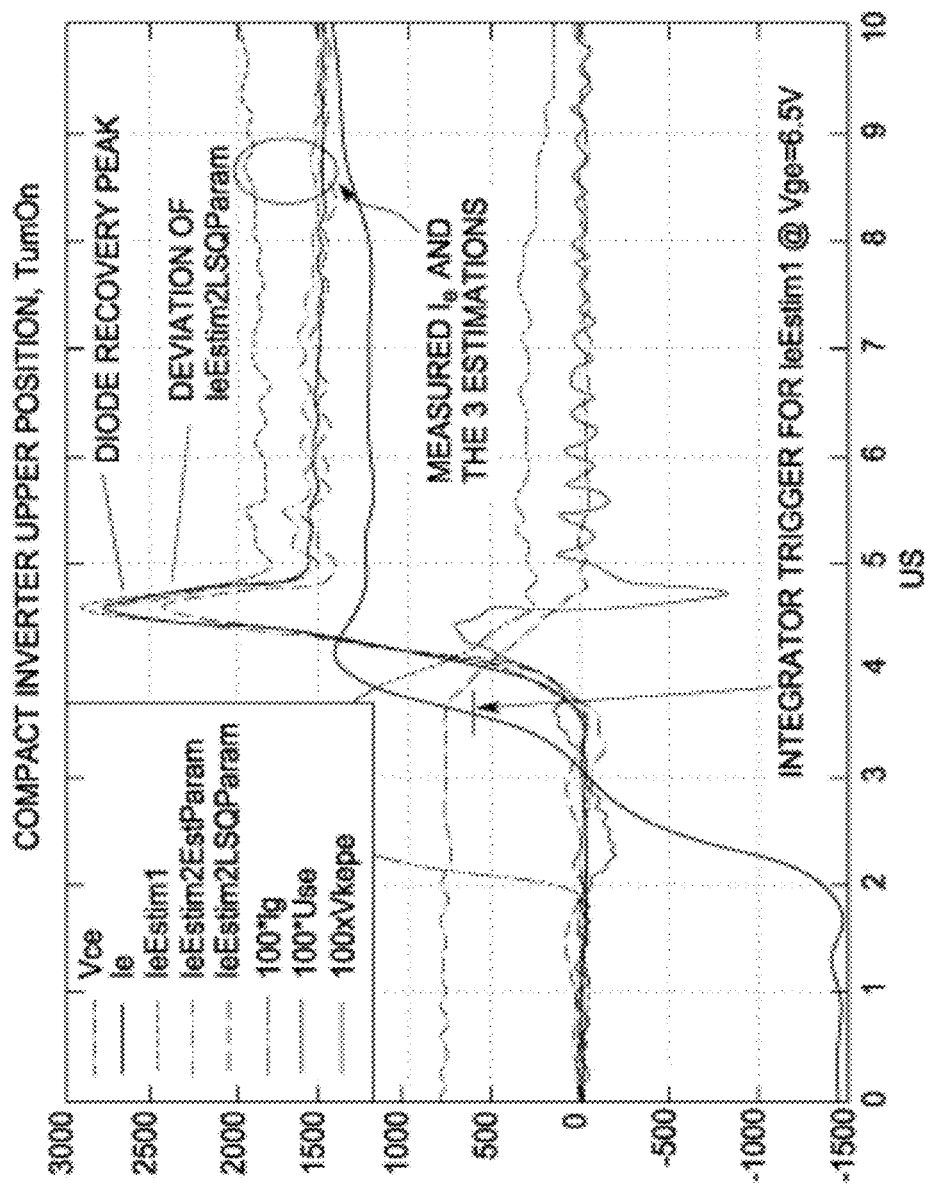

FIG. 3 highlights the parasitic inductance between the collector power terminal and the collector sense terminal for the IGBT/gate drive circuit depicted in FIG. 1;

FIG. 4 illustrates a main load current estimator for the IGBT/gate drive circuit depicted in FIG. 1, according to another embodiment of the invention; and FIG. 5 is a graph illustrating exemplary waveforms during turn-on for one embodiment of an IGBT/gate drive circuit.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

FIG. 1 is a parasitic element circuit model of an IGBT/gate drive circuit 10 illustrating an insulated gate bipolar transistor (IGBT) module 12 comprising an IGBT power switch 13 with a freewheel diode 15. The IGBT power switch 13 is driven by a gate drive circuit 14, according to one embodiment of the invention. The gate drive circuit 14 is connected to power switch 13 with additional wires for sensing purposes as described in further detail herein with reference to various embodiments. According to one embodiment, one or more analog integrators are integrated with the drive circuit 14. According to another embodiment, an analog-to-digital (A/D) conversion unit is employed in association with a digital integrator within the drive circuit 14. In some embodiments, current estimation algorithmic software resides in non-volatile memory resident in the gate drive circuit 14 or external to the gate drive circuit 14. In still another embodiment, the IGBT 13 and freewheel diode 15 are replaced by a reverse conducting IGBT which is able to conduct current in both directions without the need of an additional freewheel diode.

With continued reference to FIG. 1, some IGBT current estimations described herein with reference to the various embodiments are determined using a main IGBT collector power terminal 16, a main IGBT emitter power terminal 18, a IGBT collector sense wire terminal 20, an upper auxiliary driving terminal 22 in electrical communication with the IGBT gate parasitic elements described in further detail herein, and a lower auxiliary driving terminal 24 in electrical communication with IGBT emitter parasitic elements described in further detail herein. IGBT/gate drive circuit 10 further comprises a capacitor 26 connected between upper and lower auxiliary terminals 22, 24 to provide driving stability and speed control.

A circuit analysis of IGBT/gate drive circuit 10 shows that the differential equation for $V_{kepe}$ (voltage between the auxiliary emitter and the power emitter terminal) contains the unknown variable $I_e$ (main power switch current) and its derivative as represented by:

$$V_{kepe} = -I_{gint} \cdot R_{ke} - dI_{gint}/dt \cdot L_{ke} + I_e \cdot R_{ee2} + dI_e/dt \cdot L_{ee2} \quad (1)$$

Although IGBT internal gate current $I_{gint}$ cannot be measured directly, it can be calculated based on $I_g$ and $V_{ge}$ measurements:

$$I_{gint} = I_g - I_{cext} = I_g - C_{ge} \cdot dV_{ge}/dt \quad (2)$$

Further, the implementation of IGBT power switch 12 driven by a gate drive circuit 14 has provisions for measurement of the signals $V_{kepe}$, $V_{gedriver}$, $V_{ge}$, $I_g$, $V_{Ske}$ and $V_{C'S}$. Additional wires to the gate driver 14 may, of course, be required for some of these measurements, such as depicted for one embodiment in FIG. 1. The circuit implementations described herein advantageously yield minimal gate drive circuit complexity.

Figure 2:
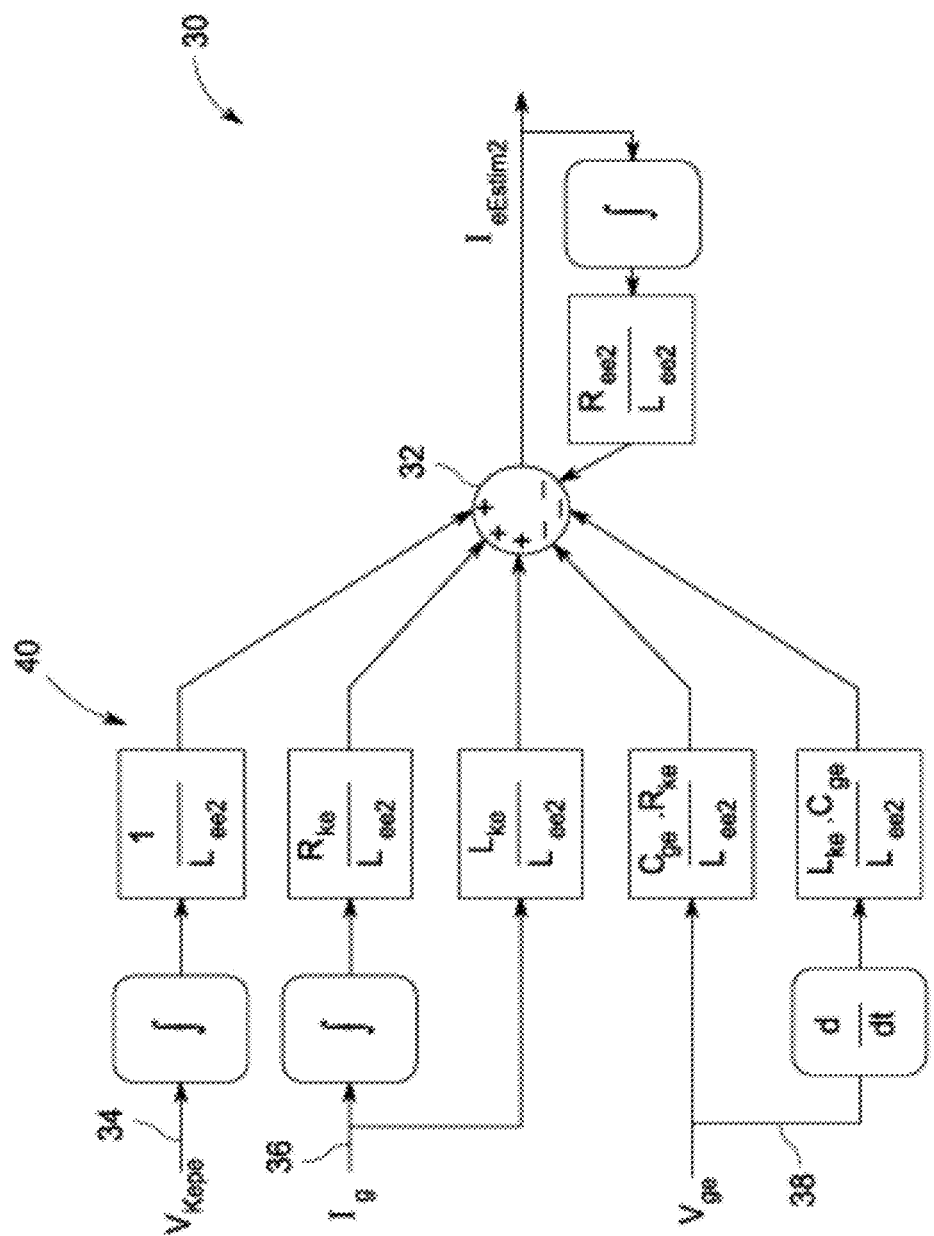
FIG. 2 illustrates one embodiment of a complex current estimator for the IGBT/gate drive circuit depicted in FIG. 1.

Keeping the foregoing features in mind, FIG. 2 illustrates one embodiment of a complex current estimator 30 for the IGBT/gate drive circuit 10 depicted in FIG. 1. In one implementation, a sum 32 of weighted averages of measured and integrated signals is accomplished with specific weighting factors. In such an implementation, driving currents 36 and voltages 34 are measured via auxiliary driving terminals 22, 24 of the IGBT 13. A time step incremental quotient or derivative of the driving voltage $V_{ge}$ 38 is also implemented. A weighted sum 32 based on the foregoing measurements and also based on corresponding parasitic element values 40 provides the desired current estimator embodiment as depicted in FIG. 2. The complex current estimator 30 thus captures the impact of $I_{gint}$ with three integrations and one derivative. The IGBT parasitics according to one embodiment are determined using estimation based on IGBT construction knowledge and fitting simulation and measurement techniques.

FIG. 3 highlights parasitic elements 50 between the collector power terminal 16 and a collector sense terminal 20 for one embodiment of the IGBT/gate drive circuit 10 depicted in FIG. 1. Various additional current estimator embodiments can be realized using these parasitic elements 50 in combination with the current estimator principles described herein. Although parasitics are multiple and possibly of distributed nature, reduced order models with lumped parameters and behavioral matching are useful in practice.

FIG. 4 illustrates a main load current estimator 60 for the IGBT/gate drive circuit 10 depicted in FIG. 1, according to another embodiment of the invention. In this embodiment, integration of measured voltage $V_{kepe}$ is performed in a defined interval with boundaries that are set to only capture a desired switching event. The impact of $I_{gint}$ is neglected in this embodiment as insignificant. Thus, only one signal ($V_{kepe}$) is measured and integrated to estimate the main load current circulating through the IGBT power switch 13. The voltage $V_{kepe}$ is a parasitic transient voltage measured between the lower auxiliary driving terminal 24 and the lower power switch main connection 18. According to a similar embodiment, the integral of a parasitic transient voltage measured between the upper power switch main connection 16 and upper auxiliary driving terminal 22 is measured and used for current estimation during a switching event. According to one aspect, the estimated power switch load current is determined from switching events that occur during non-fault switching conditions, although the principles described herein may be applied as well to fault condition switching events such as a short circuit event.

According to one embodiment, the estimation of switch current is based on integration of the voltage across the inductance in the current flow path. This current estimation is determined during normal switching transient operations and is not limited to short circuit events of the power switch. The resultant current estimation is then used in subsequent stages such as, but not limited to, an analog/digital conversion stage such as depicted in FIG. 1, to provide a result that is stored in memory. In some embodiments described herein that use measurements and parasitics using the upper power switch terminal 16 and the upper auxiliary control terminal 22, estimations of load currents circulating through the power switch 13 are more challenging since there is high voltage between the upper terminal 16 and lower auxiliary driving terminal 24 which is used as common ground.

Other embodiments of current estimation techniques using the principles described herein can be implemented using a full-order observer or a reduced-order observer and a Kalman filter to include the effect of noise. The desired estimation according to one embodiment is performed on-line in a programmable device such as an FPGA/CLPD device using a recursive update (fast Kalman filter algorithm) to determine $dV_{geInt}/dt$ and $dI_{ce}/dt$ as represented by:

$$dV_{geInt}/dt=1/C_{ge}\cdot(I_g-I_{CgeExt}-I_{gc}) \quad (3)$$

$$dI_{ce}/dt\approx=g_m/C_{ge}\cdot(I_g-C_{geExt}dV_{ge}/dt-C_{cg}(V_{cg})\cdot L_{\sigma}d^2I_{ce}/dt^2) \quad (4)$$

The foregoing observer implements a linearized version of the dynamic system 10, modeling the input circuitry. Several variants of such observers are possible, encompassing noise effects and order reduction based on the number of measured signals.

FIG. 5 is a graph illustrating exemplary estimated waveforms of load current circulating through a power switch during a turn-on switching event for one embodiment of an IGBT/gate drive circuit. In one embodiment, the estimated current $I_e$Estim1 can be seen to be drifting away due to integration of voltage offset $I_e*R_{ee2}$ that is required to determine the estimation. In another embodiment, the estimated current $I_e$Estim2 is illustrated using LSQ (least squares) parameters. In another embodiment, the estimated current $I_e$Estim2 Param using estimated parasitic parameters exhibits a smaller deviation in the recovery as compared to $I_e$Estim2LSQParam using LSQ parameters. Both embodiments estimating power switch current as $I_e$Estim2 can be seen to be fitting well to actual measured values following the recovery peak. Deviations of estimate current from actual measured current between 8 μsec and 9 μsec on the graph show IeEstim1 deviating by about 27%, IeEstim2EstParam deviating by about 4%, and IeEstim2LSQParam deviating by about −2%.

In summary explanation, according to one embodiment, a power switch current estimator 10 comprises a solid state power switch 13 comprising a control terminal 22, an input current power terminal 16, an output current power terminal 18, and a sense wire terminal 24, wherein one or more parasitic elements define an electrical pathway between the output current power terminal 18 and the sense wire terminal 24. A driver unit 14 is connected to the control terminal 22 and the sense wire terminal 24 and is configured to selectively turn the power switch 13 on and off while a positive voltage appears across the input current power terminal 16 and the output current power terminal 18. The current estimator is configured to generate an estimated level of current circulating in real time through the solid state power switch 13 in response to one or more switching events. The estimated level of current is based on values of at least one of the parasitic elements such that the estimated level of load current substantially corresponds to an actual level of load current circulating through the solid state power switch 13.

According to another embodiment, an estimation of the main load current circulating through a high power switch 13 takes place at a driver unit 14 of the switch 13 without any need for mounting dedicated large scale current sensors in the system. This estimated current is then used for condition (health) monitoring of the switch or for estimating certain temperatures useful in determining the condition/health of the switch. A high resolution voltage sensor is employed across the main switch power terminals 16, 18 or between sensing terminals 20, 24. Such high resolution in needed only during the conduction mode when the voltage across the switch is comparatively small. A counter is employed for counting the number of occurrences when the voltage across the main power switch terminals 16, 18 or across sensing terminals 20, 24 exceeds a value stored in a non-volatile memory unit. A corresponding logic controller may issue a feedback signal to a central controller when the count number exceeds a desired threshold, or optionally may issue a self turn-off command to the gate driver 14.

More specifically, the non-volatile memory that is part of the gate drive circuit 14 in one embodiment stores Vce and/or Ice characteristics of healthy power switches. The Ice current is then estimated using the principles described herein. The Vce voltage is measured with a high-resolution, low voltage sensor while the power switch 13 is in a conducting state. A determination is made as to whether the measured value of Vce is larger than the stored value. An internal counter is incremented by one each time the measured value of Vce is larger than the stored value. If and when the counter exceeds a specified number, an alarm (feedback signal) is transmitted to a central controller or is employed to shut-down the power switch 13. A physical health estimator is thus implemented using the foregoing principles.

According to another embodiment, a temperature estimator and protective turn-off system is implemented by storing in non-volatile memory at the driver 14, Vce (Ice) characteristics of health switches at different temperatures. The Ice current is then estimated using the foregoing principles. The Vce voltage is measured using a high-resolution, low voltage sensor while the power switch 13 is in a conducting state. According to one embodiment, this measurement occurs about 20 μsec after current stabilization such as depicted in FIG. 5. An inverse function in a field programmable gate array device is employed to estimate the operating temperature. If the temperature exceeds a pre-specified (allowed) threshold, a self-turn off command is issued causing the gate drive circuit 14 to shut down the power switch 13.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A power switch current estimator, comprising:
a solid state power switch connected to a control terminal, an input current power terminal, an output current power terminal, and at least one sense wire terminal, wherein one or more parasitic elements define an electrical pathway between the at least one sense wire terminal and a corresponding power terminal;
a driver unit connected to the control terminal and the at least one sense wire terminal and configured to selectively turn the solid state power switch on and off; and
a current estimator configured to generate an estimated level of current circulating through the solid state power switch in real time in response to one or more switching events, wherein the estimated level of current is based on values of at least one of the one or more parasitic elements such that the estimated level of current substantially corresponds to an actual level of the current circulating through the solid state power switch, and wherein the current estimator comprises a summer configured to determine a weighted average of measured and integrated voltage and current signals with predefined weighting factors based on the values of the one or more of the parasitic elements.

2. The power switch current estimator according to claim 1, wherein the solid state power switch comprises an IGBT device, the control terminal is a gate drive terminal of the IGBT device, the input current power terminal is a collector terminal of the IGBT device, and the output current power terminal is an emitter terminal of the IGBT device.

3. The power switch current estimator according to claim 1, wherein the summer is further configured to determine the weighted average based on a time step incremental quotient or derivative of a driving voltage generated via the driver unit, and wherein the time step incremental quotient or derivative of the driving voltage is weighted based on the values of the one or more of the parasitic elements.

4. The power switch current estimator according to claim 1, wherein the current estimator is further configured to generate the estimated level of current circulating through the solid state power switch based on a voltage generated between the at least one sense wire terminal and the corresponding power terminal during a power switch turn on or turn off event.

5. The power switch current estimator according to claim 1, wherein the at least one sense wire terminal comprises an input current sense wire terminal, such that one or more parasitic elements define an electrical pathway between the input current power terminal and the input current sense wire terminal.

6. The power switch current estimator according to claim 5, wherein the current estimator is further configured to generate the estimated level of current circulating through the solid state power switch based on a voltage generated between the input current power terminal and the input current sense wire terminal during a power switch predefined turn on or turn off event period in response to one or more switching events.

7. The power switch current estimator according to claim 6, wherein the current estimator is further configured to generate the estimated level of current circulating through the solid state power switch based on a corresponding parasitic element weighting factor.

8. The power switch current estimator according to claim 1, wherein the at least one sense wire terminal comprises an output current sense wire terminal, such that one or more parasitic elements define an electrical pathway between the output current power terminal and the output current sense wire terminal.

9. The power switch current estimator according to claim 8, wherein the current estimator is further configured to generate the estimated level of current circulating through the solid state power switch based on a voltage generated between the output current power terminal and the output current sense wire terminal during a power switch turn on or turn off event.

10. The power switch current estimator according to claim 9, wherein the current estimator is further configured to generate the estimated level of current circulating through the solid state power switch based on a corresponding parasitic element weighting factor.

11. The power switch current estimator according to claim 1, wherein the current estimator comprises a full-order observer or a reduced-order observer and further comprises a Kalman filter configured to include the effect of noise, and wherein the observer and Kalman filter together are configured to generate the estimated level of current circulating through the solid state power switch in response to observed input signals.

12. The power switch current estimator according to claim 1, further comprising a high resolution low voltage sensor connected to the input and output current power terminals or sensing terminals and configured to generate a count pulse each time the voltage across the input and output current power terminals or sensing terminals exceeds a predefined threshold voltage level in response to power switch conduction mode events.

13. The power switch current estimator according to claim 12, further comprising a counter configured to track the count pulses and generate a feedback signal when the number of count pulses exceeds a predefined number.

14. The power switch current estimator according to claim 1, further comprising a high resolution low voltage sensor connected to the input and output current power terminals or sensing terminals and configured to measure the voltage across the input and output current power terminals during the on-state of the solid state power switch about 20 μsec after stabilization of the current circulating through the solid state power switch following a power switch turn on event.

15. The power switch current estimator according to claim 14, further comprising a programmable logic device configured to implement an inverse function based on the measured voltage to generate an estimated power switch operating temperature therefrom.

16. The power switch current estimator according to claim 15, further comprising a logic system configured to generate a self-turn-off command if the estimated temperature exceeds a prespecified threshold level.

17. The power switch current estimator according to claim 1, wherein the one or more parasitic elements are selected solely from sense wire parasitic elements and power switch parasitic elements.

18. The power switch current estimator according to claim 1, wherein the solid state power switch, the driver unit and the current estimator are devoid of large scale current sensors.

19. The power switch current estimator according to claim 1, wherein the one or more parasitic elements consist of one or more sense wire inductance elements, one or more sense wire resistance elements, power switch inductance elements, and power switch resistance elements.

20. The power switch current estimator according to claim 1, wherein the solid state power switch comprises a reverse conducting IGBT device, the control terminal is a gate drive terminal of the reverse conducting IGBT device, the input current power terminal is a collector terminal of the reverse conducting IGBT device, and the output current power terminal is an emitter terminal of the reverse conducting IGBT device.

* * * * *